US006496960B1

(12) United States Patent
Kashyap et al.

(10) Patent No.: US 6,496,960 B1
(45) Date of Patent: Dec. 17, 2002

(54) DRIVING POINT MODEL UTILIZING A REALIZABLE REDUCED ORDER CIRCUIT FOR DETERMINING A DELAY OF A GATE DRIVING AN INTERCONNECT WITH INDUCTANCE

(75) Inventors: Chandramouli V. Kashyap, Austin, TX (US); Byron Lee Krauter, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 09/697,447

(22) Filed: Oct. 27, 2000

(51) Int. Cl.$^7$ .............................................. G06F 17/50
(52) U.S. Cl. ........................ 716/4; 716/5; 716/6; 703/2
(58) Field of Search ....................................... 716/1–21

(56) References Cited

U.S. PATENT DOCUMENTS

| | | | | | |
|---|---|---|---|---|---|
| 5,841,672 A | * | 11/1998 | Spyrou et al. | .................. | 716/6 |
| 6,041,170 A | * | 3/2000 | Feldmann et al. | ............. | 703/2 |
| 6,308,304 B1 | * | 10/2001 | Devgan et al. | ................. | 716/5 |

OTHER PUBLICATIONS

Arunachalam, R., F. Dartu and L. T. Pileggi, "CMOS Gate Delay Models for General RLC Loading", Proc. ICCAD, pp. 224–229, Oct. 1997*.

Devgan, A., and R. A. Rohrer, "Adaptively Controlled Explicit Simulation", IEEE Trans. On CAD, Jun. 1994.

Devgan, A., and P. R. O'Brien, "Realizable Reduction for RC Interconnect Circuits", Proc. ICCAD, Nov. 1999*.

Krauter, B., and S. Mehrotra, "Layout Based Frequency Dependent Inductance and Resistance Extraction for On–Chip Interconnect Timing Analysis", Proc. DAC, Jun. 1998*.

O'Brien, P.R. and T. L. Savarino, "Modeling the Driving–Point Characteristic of Resistive Interconnect for Accurate Delay Estimation", Proc. ICCAD, pp. 512–515, Nov. 1989*.

Pillage, L. T., and R. A. Rohrer, "Asymptotic Waveform Evaluation for Timing Analysis", IEEE Trans. On CAD, Apr. 1990.

Qian, J., S. Pullela, and L. Pillage, "Modeling the Effective Capacitance" for the RC Interconnect of CMOS Gates, IEEE Trans. On CAD, Dec. 1994.

Rubinstein, J., P. Penfield, Jr., and M. A. Horowitz, "Signal Delay in RC Tree Networks", IEEE Trans. On CAD, Feb. 1983.

Kashyap, C. V., and B. L. Krauter, "A Realizable Driving Point Model for On–Chip Interconnect with Inductance", Proceedings of the Design Automation Conference, Jun. 2000.

Feldmann, P., and R. W. Freund, "Efficient Linear Circuit Analysis by Pade Approximation via the Lanczos Process", IEEE Trans. On CAD, May 1995.

Kahng, A.B., and S. Muddu, "An Analytical Delay Model for RLC Interconnects", IEEE Trans. On CAD, Dec. 1997.

* cited by examiner

Primary Examiner—Matthew Smith
Assistant Examiner—Andrea Liu
(74) Attorney, Agent, or Firm—Robert M. Carwell; Bracewell & Patterson, L.L.P.

(57) ABSTRACT

A method for determining an equivalent load at the output of a gate driving an interconnect having resistive, inductive and capacitive elements. The method includes modeling the interconnect utilizing a passive driving point model to derive a realizable reduced order circuit for the interconnect. In an advantageous embodiment, the realizable reduced order circuit includes a first resistance parallel-coupled to an inductance and series-coupled to a pi-model equivalent circuit that includes a second resistance and first and second capacitances.

23 Claims, 5 Drawing Sheets

*Fig. 5B*

DRIVING POINT MODEL UTILIZING A REALIZABLE REDUCED ORDER CIRCUIT FOR DETERMINING A DELAY OF A GATE DRIVING AN INTERCONNECT WITH INDUCTANCE

BACKGROUND OF THE INVENTION

1. Technical Field

The present invention relates in general to semiconductor design automation systems, and in particular to the simulation of integrated circuit designs of such systems. More specifically, the present invention relates to a driving point model utilizing a realizable reduced order circuit for determining a delay of a gate driving an interconnect having resistive, capacitive and inductive elements and a method of operation thereof.

2. Description of the Related Art

Development of a working integrated circuit chip is a process that involves creating a design specification, creating the logical design of the chip (typically in schematic form), validating the design, re-designing as necessary, fabricating the chip and testing the chip. Costs tend to be "end-loaded," i.e., greater towards the end of the process than towards the beginning. The earlier in this process that a design error is detected, the earlier it can be corrected, saving a great deal of cost over a late-detected error. As a result, increasingly sophisticated steps are being taken to validate the design of a new chip, as early in the design process as possible.

Design validation requires thorough examination of the integrated circuit design and expected functional characteristics, taking into account a number of different factors, such as logical correctness of the design, timing factors (including net delay performance, effects of parasitic capacitances, etc.). Among these factors, net performance (specifically, net delay) is one of the most important. Many timing-related problems have been discovered in chips whose designs appear to be "logically" correct, at least on paper. This is because it is difficult for the designer to anticipate such delay contributors as wiring delays, i.e., net delays and the cumulative effects of distributed resistances, inductances and capacitances on the chips, especially from a post-layout point of view. The accuracy of delay determination affects not only the chip performance, but whether a chip meets its original design specification.

Virtually all integrated circuit designers today use semiconductor design automation systems which facilitate the capture, simulation, layout, and verification of integrated circuit designs. With the advance of semiconductor process technology, integrated circuits are becoming increasingly fast, and the once relatively small delays caused by interconnections, i.e., wiring, on a chip are becoming a more dominant factor in integrated circuit performance. As a result, the ability to accurately model and calculate delays is a crucial requirement for any semiconductor design automation system.

From any driving point to any receiving point on a net, there is an associated delay. This time is due to a complicated combination of parasitic capacitances, wiring resistances, wire lengths, etc. Some nets have multiple drivers, e.g., a number of open-drain or tri-state drivers, or loops, e.g., clock rings, making their (accurate) analysis particularly complicated. The delay for a net is determined by modeling the net and analyzing the delay according to the model. One of the most serious problems in delay calculation (determination) is that accurate models tend to complicate delay calculations, resulting in expensive delays in the design cycle while computation-intensive net delays are being calculated. As a result, most prior-art net delay calculation techniques compromise on the accuracy (faithfulness to reality) of the model of the net in order to decrease the amount of calculation time required. Unfortunately, in doing so most such techniques sacrifice enough accuracy that the results of delay calculation are only very rough approximations of actual chip performance. As a result, many chips, particularly those with complicated timing relationships between signals, have subtle timing-related problems when they are built. The designs of such chips must then be altered, re-simulated, etc., and a new chip must be fabricated. This process is extremely costly.

It has been well established that interconnect effects must be accounted for to ensure accurate static timing analysis. Traditionally, gate level static timing analyzers have broken down the path delay as the sum of the gate delay and the wire or interconnect delay. Since the interconnect is a linear circuit, model order reduction techniques based on moment matching have been employed to compute its delay efficiently. However, since gates are non-linear devices, two distinct approaches have been used for fast computation of gate delay. Firstly, the gate delay is precharacterized in terms of input transition time and output load capacitance using detailed circuit simulators such as SPICE and implemented using lookup-tables. Alternatively, the gate delay is obtained "on the fly" using fast timing simulators, see, e.g., A. Devgan and R. A. Rohrer "Adaptively Controlled Explicit Simulation," IEEE Trans. On CAD, June 1994.

Regardless of the method used to compute gate delays, an accurate characterization of the loading due to the interconnect at the output of the gate must be made. While a simple approach would be to lump the total capacitance of the interconnect at the output of the gate, the resistive shielding renders such a model inaccurate. A more accurate model for RC interconnect, the so called pi-model, has been used in many timing analysis and physical design tools for modeling the driving point load. However, the pi-model can no longer be used if the inductive effects are significant; and with faster signal transition times, increasing die sizes, and the advent of newer materials such as copper, on-chip inductance can no longer be ignored.

Accordingly, what is needed in the art is an improved driving point model that mitigates the above-described limitations in the prior art. More particularly, what is needed in the art is a driving point model for interconnects having resistive, capacitive and inductive elements.

SUMMARY OF THE INVENTION

It is therefore an object of the invention to provide an improved driving point model for interconnects having inductance.

It is another object of the invention to provide a method for determining an equivalent load at a gate driving an interconnect having resistive, capacitive and inductive elements.

It is another object of the invention to provide a method for determining a delay at a gate driving an interconnect having resistive, capacitive and inductive elements.

To achieve the foregoing objects, and in accordance with the invention as embodied and broadly described herein, a method for determining an equivalent load at the output of a gate driving an interconnect having resistive, inductive and capacitive elements is disclosed. The method includes modeling the interconnect utilizing a passive driving point model to derive a realizable reduced order circuit for the interconnect. In an advantageous embodiment, the realizable reduced order circuit includes a first resistance parallel-coupled to an inductance and series-coupled to a pi-model equivalent circuit, where the pi-model equivalent circuit includes a second resistance and first and second capacitances. In a related embodiment, the first four moments of an input admittance of the interconnect are obtained to model the interconnect, where the first four moments are characterized by:

$z_{-1} = 1/C$, $z_0 = [(1+k)^2 R2]/4$, $z_1 = L - (1/16)C(1-k)(1+k)^3 R2^2$, and $z_2 = (1/64)C^2(1-k)^2(1+k)^4 R2^3 - (L^2/R1)$, wherein $z_{-1}$, $z_0$, $z_1$, and $z_2$ are the first, second, third and fourth moments, respectively, L, R1 and R2 are the inductance, first and second resistances, respectively, k is a realizability parameter and the first and second capacitances are defined by $(1-k)(C/2)$ and $(1+k)(C/2)$, respectively. Next, the realizable reduced order circuit is utilized to determine the equivalent load that, in an advantageous embodiment, is an effective capacitance value of the interconnect.

In another aspect of the present invention, utilizing the realizable reduced order circuit to derive the effective capacitance of the interconnect includes approximating a driving point admittance of the interconnect with the realizable reduced order circuit. Next, an effective capacitance value of the interconnect is initialized to be the total capacitance value of the interconnect. Following which, a Thevenin circuit model for the gate is derived. Subsequently, the charges delivered by the Thevenin gate model to the effective capacitance and the realizable reduced order circuit are computed. The effective capacitance value is then updated by equating an average current drawn by the effective capacitance to an average current drawn by the realizable reduced order circuit. The process is repeated beginning with deriving a new Thevenin circuit model with the updated effective capacitance value until the effective capacitance value converges.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
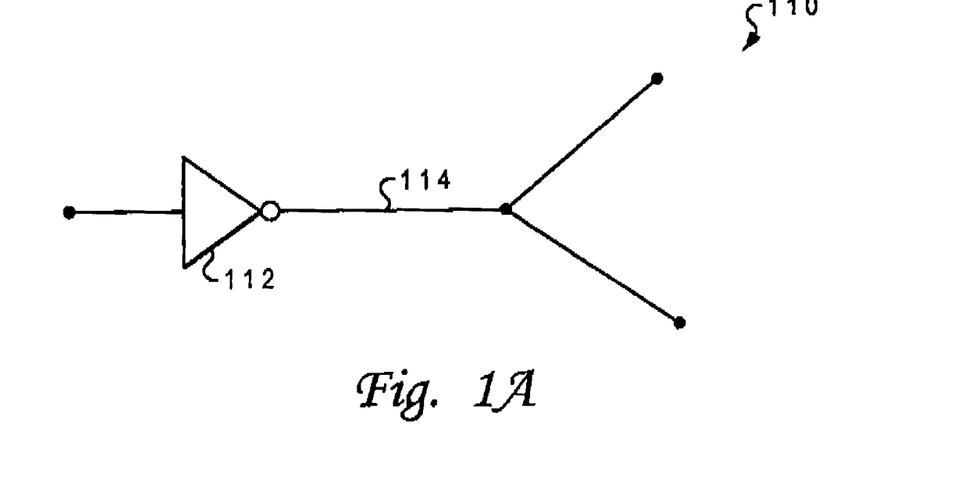
FIG. 1A illustrates an exemplary circuit that depicts a gate driving an interconnect.

The intuition underlying the driving point model disclosed by the present invention can explained with the aid of an exemplary circuit 110 illustrated in FIG. 1A that depicts a gate 112 driving an interconnect 114. Suppose that Y(s), the input admittance of interconnect 114, can be expanded about s=0 as follows:

$$Y(s) = y_1 s + y_2 s^2 + y_3 s^3 + y_5 s^4 + \ldots \qquad (1)$$

Figure 1B:
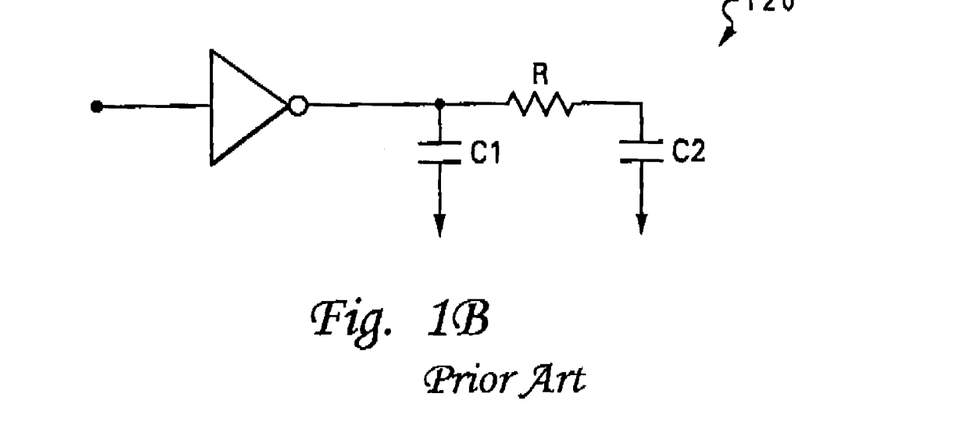
FIG. 1B illustrates a pi-model representation of an interconnect.

The coefficients $y_1, y_2, \ldots$ are the moments of Y(s). It should be noted that $y_0=0$ if there is no DC path to ground, a condition assumed. By matching the first three non-zero moments of the admittance of interconnect 114 with the pi-circuit shown in FIG. 1B, the elemental values, i.e., R, C1 and C2, can be synthesized utilizing the first three moments of Y(s), see, e.g., P. R. O'Brien and T. L. Savarino "Modeling the Driving-Point Characteristic of Resistive Interconnect for Accurate Delay Estimation," Proc. ICCAD, pp. 512–515, 1989. The first three admittance moments of general resistive and capacitive (RC) circuits satisfy:

$$y_1 > 0, \; y_2 < 0, \; y_3 > 0 \qquad (2)$$

$$y_1 y_3 - y_2^2 > 0 \qquad (3)$$

This in turn guarantees the realizability of the pi-model for RC circuits. However, while $y_1 > 0$ and $y_2 < 0$ do hold for resistive, inductive and capacitive (RLC) circuits, nothing can be said about the sign of $y_3$ and the inequality (3) that depend on the inductance in the circuit. Thus, the pi-model may be unsynthesizable even if the interconnect is mildly inductive.

To facilitate the following development, the following discussion will be centered around the input impedance Z(s) where Z(s)=1/Y(s). Z(s) can be written in terms of moments as:

$$Z(s) = (z_{-1}/s) + z_0 + z_1 s + z_2 s^2 + \ldots \qquad (4)$$

The moments of $Z(s)$ are related to those of $Y(s)$ by:

$$z_{-1} = 1/y_1 \tag{5}$$

$$z_0 = -(y_2/y_1^2) \tag{6}$$

$$z_1 = (y_2^2 - y_1 y_3)/y_1^3 \tag{7}$$

Since the interconnect is modeled with a lumped, passive resistive, inductive and capacitive (RLC) circuit, $Z(s)$ satisfies a necessary and sufficient condition, known as the Positive Real (PR) property, stated in the following two equivalent forms below:

$Z(s)$ is a rational function of s with real coefficients so that $Z(s)$ is real when s is real.

$\text{Re}[Z(s)] \geq 0$ if $\text{Re}[s] > 0$

Or, $Z(s)$ is a rational function of s with real coefficients so that $Z(s)$ is real when s is real.

For all real w, $\text{Re}[Z(jw)] \geq 0$

All poles of $Z(s)$ are in the closed Left Half Plane (LHP) of the s plane i.e., inside the LHP or on the jw-axis. All jw-axis poles are simple with positive real residues.

Since there is no DC path to ground, $Z(s)$ has a pole at the origin and is of the form:

$$Z(s) = \frac{a_0 + a_1 s + \ldots + a_n s^n}{s(1 + b_1 s + \ldots + b_m s^m)} \tag{8}$$

where $n \leq m$. Separating out the pole at origin, we have:

$$Z(s) = \frac{a_1 + a_2 s + \ldots + a_n s^{n-1} - a_0 b_1 - a_0 b_2 s - \ldots - a_0 b_m s^{m-1}}{1 + b_1 s + \ldots b_m s^m} + \frac{a_0}{s} \tag{9}$$

$$Z(s) = (a_0/s) + Z'(s) \tag{10}$$

The PR property assures us that $a_0 > 0$, thus implying $z_{-1} > 0$. As shown hereafter, $Z'(s)$ satisfies the PR property since $Z(s)$ satisfies the PR property. From equation (9), it is clear that $Z'(s)$ is a rational function of s that is real when s is real. Next, $\text{Re}[Z(jw)] = \text{Re}[Z'(jw)]$. Since, for all real w, $\text{Re}[Z(jw)] \geq 0$, this implies that $\text{Re}[Z'(jw)] \geq 0$. Finally, it should be noted that $Z(s)$ can be written as:

$$Z(s) = \frac{k_0}{s} + \sum \frac{k_i}{(s - p_i)} = \frac{a_0}{s} + Z'(s) \tag{11}$$

where $a_0 = k_0$ and $k_i$, $p_i$ could be complex. It should also be noted that all the poles and residues of $Z'(s)$ are the same as the poles and residues of $Z(s)$, except for the pole at the origin. Therefore, all poles of $Z'(s)$ are in the closed Left Half Plane (LHP) of the s plane, i.e., inside the LHP or on the jw-axis. All jw-axis poles are simple with positive real residues. As a result, $Z'(s)$ also satisfies the PR property.

Figure 1C:
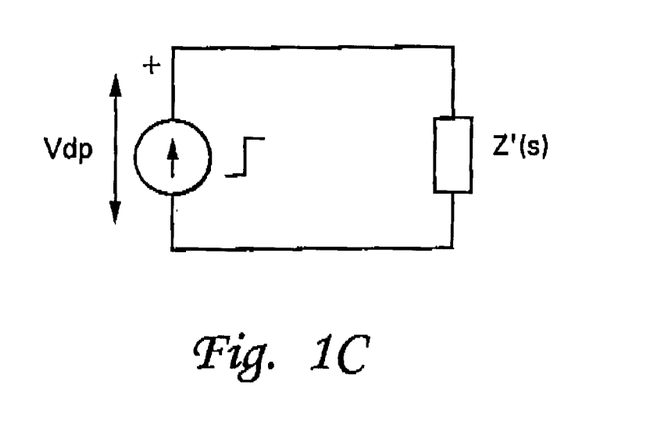
FIG. 1C illustrates a simplified circuit diagram of a step current source driving an input impedance of a passive circuit.

Since the PR property is both a necessary and sufficient condition for the realization using lumped RLC elements, $Z'(s)$ is the input impedance of some passive circuit. This observation in fact ensures that $z_0$ is also positive, just as is the case for RC circuits. Consider a step current source driving $Z'(s)$ as shown in FIG. 1C. The voltage at the driving point is given by:

$$V_{dp}(s) = \frac{z_0}{s} + z_1 s + \ldots \tag{12}$$

Applying the Final Value Theorem, the final value of $V_{dp}$ turns out to be $z_0$ which must be positive since $Z'(s)$ is passive. In fact, this is no surprise since the $y_1$ and $Y_2$ moments of $Y(s)$ are independent of any inductance in the circuit. That is, even for RLC circuits, $y_1$ and $y_2$ behave as if the interconnect was a pure RC circuit. This makes $y_1 > 0$ and $y_2 < 0$ and therefore $(z_0 = -y_2/y_1^2) > 0$.

To get a better feel for the above fact and to reason about the signs of $z_1$ and $z_2$, explicit expressions for the first three moments of $Z(s)$ are now derived for an arbitrary RLC tree. Consider a general RLC tree being driven by a voltage source and assuming that the only capacitors in the circuit are capacitors to ground and that there is no DC path to ground. If $Y(s)$ is the input admittance of the tree and $V(s)$ is the input voltage source, we have:

$$Y(s)V(s) = \tag{13}$$

$$I(s) = s\sum_{i=1}^{n} C_i V_i = \sum_{i=1}^{n} C_i \left[ V(s) - s \sum_{j=1}^{n} (R_{ji} + sL_{ji}) C_j V_j \right]$$

where $(R_{ji} + sL_{ji})$ is the total impedance of a path common to nodes i and j, as defined in equation (13).

$$Y(s) = s \sum_{i=1}^{n} C_i \left[ 1 - s \sum_{j=1}^{n} (R_{ji} s L_{ji}) C_j H_j \right] \tag{14}$$

where $H_j$ is the transfer function of the $j^{th}$ node. Expanding $Y(s)$ in powers of s and matching like powers we get $y_0 = 0$ and the next three moments as:

$$y_1 = \sum_{i=1}^{n} C_i \tag{15}$$

$$y_2 = -\sum_{i=1}^{n} C_i \left( \sum_{j=1}^{n} R_{ji} C_j \right) \tag{16}$$

$$y_3 = \sum_{i=1}^{n} C_i \left( \sum_{j=1}^{n} R_{ji} C_j m_j^{(1)} \right) - \sum_{i=1}^{n} C_i \left( \sum_{j=1}^{n} L_{ji} C_j \right) \tag{17}$$

where $m_j^{(1)}$ is the first moment (Elmore delay) of $H_j$ and is given by:

$$m_j^{(1)} = \sum_{k=1}^{n} R_{kj} C_k \tag{18}$$

This analysis clearly shows that: the first two moments of $Y(s)$ are independent of L, the first moment is positive and the second is negative thereby implying $z_{-1} > 0$ and $z_0 > 0$, and that $y_3$ though initially positive, becomes negative when the inductive effects start dominating. It is clear from equations (17) and (7) that although $z_1$ is negative for small values of interconnect inductance, if we increase the inductance (or decrease the resistance) in all the branches of the tree, it becomes positive and stays positive. Note that by virtue of inequality (3), a pi-circuit cannot be synthesized when $z_1 > 0$.

To summarize, while we know the signs of $z_{-1}$ and $z_0$, we cannot say much about the signs of $z_1$, $z_2$, etc. It should be noted that $z_2=(-z_1y_2-z_0y_3-z_{-1}y_4)/y_1$. However, as the inductance starts dominating the resistance in the circuit, $z_1$ becomes positive, and $z_2$ which was positive for RC circuits, becomes negative. In the limiting case, when the interconnect reduces to a pure LC circuit, all the even-numbered moments $z_0$, $z_2$, . . . become zero and the odd-numbered moments alternate in sign with $z_1$ being positive. Any reduced order synthesis method, using the first four moments should, therefore, produce a realizable circuit for the four possible sign combinations of $z_1$ and $z_2$.

SYNTHESIZING THE RLC DRIVING POINT MODEL

Consider the expansion of Z(s) into the first four moments:

$$Z(s) = \frac{z_{-1}}{s} + z_0 + z_1 s + z_2 s^2 = Z_a(s) + Z_b(s) \quad (19)$$

where $Z_a(s)=(z_{-1}/s)+z_0$ and $Z_b(s)=z_1s+z_2s^2$. $Z_a(s)$ can be realized as a resistance in series with a capacitance. Furthermore, suppose $Y_b(s)=(y_{b0}/s)+y_{b1}+\ldots=1/(Z_b(s))$. By cross multiplying and equating the like powers, we get $y_{b0}=1/z_1$ and $y_{b1}=-z_2/z_1^2$. Thus, Z(s) can be implemented as shown in FIG. 2B by matching the first four moments with the original interconnect circuit. However, while R2 and C are guaranteed positive, for L>0 and R1>0 we must have $z_1>0$ and $z_2<0$ which as discussed previously cannot be guaranteed for RLC circuits.

Figure 2A:
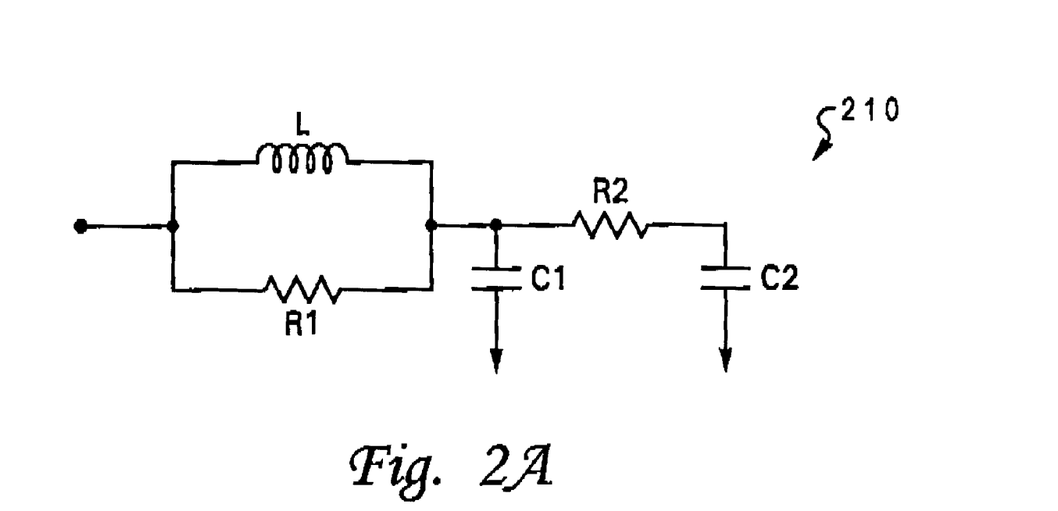
FIG. 2A illustrates an embodiment of a realizable reduced order circuit according to the principles disclosed by the present invention.
Figure 2B:
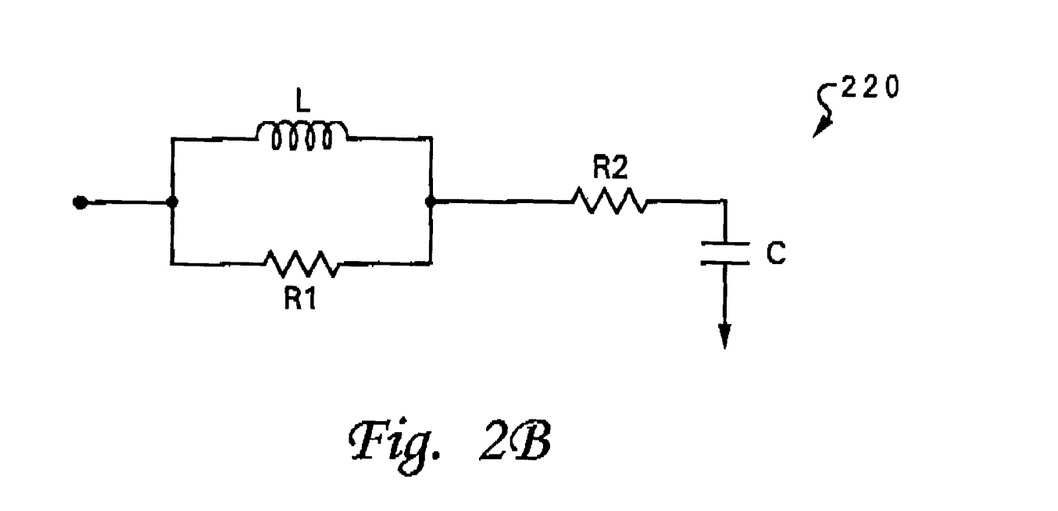
FIG. 2B illustrates the realizable reduced order circuit of FIG. 2A with a realizability parameter equal to one.

However, if the circuit in FIG. 2B is modified to the realizable reduced-order circuit of the present invention illustrated in FIG. 2A, then realizability is assured regardless of the signs of $z_1$ and $z_2$. Although we are still matching four moments, by introducing a fifth parameter, a realizability parameter k, we have acquired the added flexibility in assigning positive values to the elements of the reduced order circuit. For a greater understanding of the realizability parameter k, see A. Devgan and P. R. O'Brien "Realizable Reduction of RC Interconnect Circuits," Proc. ICCAD, 1999. It should be noted that $-1<k\leq1$ since C1>0 and C2>0. Thus, for k=1, this circuit reduces to the one shown in FIG. 2B. The realizability parameter k provides a family of circuits all having the same topology and matching the same number of moments. This enables us to choose a particular circuit by assigning an appropriate value to k, based on the signs of $z_1$ and $z_2$.

The first four moments of the reduced order circuit depicted in FIG. 2A are given by:

$$z_{-1} = \frac{1}{C} \quad (20)$$

$$z_0 = \frac{(1+k)^2 R2}{4} \quad (21)$$

$$z_2 = \frac{1}{64}C^2(1-k)^2(1+k)^4 R2^3 - \frac{L^2}{R1} \quad (23)$$

To ensure L>0, utilizing equations (21) and (22), we obtain:

$$x > -\frac{z_1}{Cz_0^2} \quad (24)$$

where x=(1−k)/(1+k). Similarly, to ensure R1>0, we obtain:

$$z_0^3 C^2 x^2 - z_2 < 0 \quad (25)$$

All the possible sign combination of $z_1$ and $z_2$ and the constraints they place on the value of x are summarized below in Table 1.

TABLE 1

Selecting the value of x

| $z_1$ | $z_2$ | x |
|---|---|---|
| >0 | <0 | Any positive real x. We arbitrarily set x = 0 |
| >0 | >0 | $x > \sqrt{z_2/(z_0^3 C^2)}$ |
| <0 | <0 | $x > -z_1/(Cz_0^2)$ |
| <0 | >0 | $x > \max\left(-z_1/(Cz_0^2),\ \sqrt{z_2/(z_0^3 C^2)}\right)$ |

When $z_1$ and $z_2$, equations (24) and (25) are satisfied for any positive real x. When this case occurs, we choose x=0 (which corresponds to k=1) and our reduced order circuit reduces to the one shown in FIG. 2B. When $z_1>0$ and $z_2>0$, equation (24) is still satisfied; however, satisfying equation (25) requires that some of the total capacitance C be moved from C2 to C1. For the remaining two sign combinations, i.e., $z_1<0$, one can therefore either synthesize an RC pi-circuit (which matches the first three moments) or the realizable reduced order circuit depicted in FIG. 2A (which matches the first four moments). For all the other cases when the pi-model is not synthesizable, the driving point waveform when a driver is loaded by the realizable reduced order circuit of the present invention depicted in FIG. 2A matches well with the driving point waveform when the driver is loaded by the original interconnect.

Figure 3:
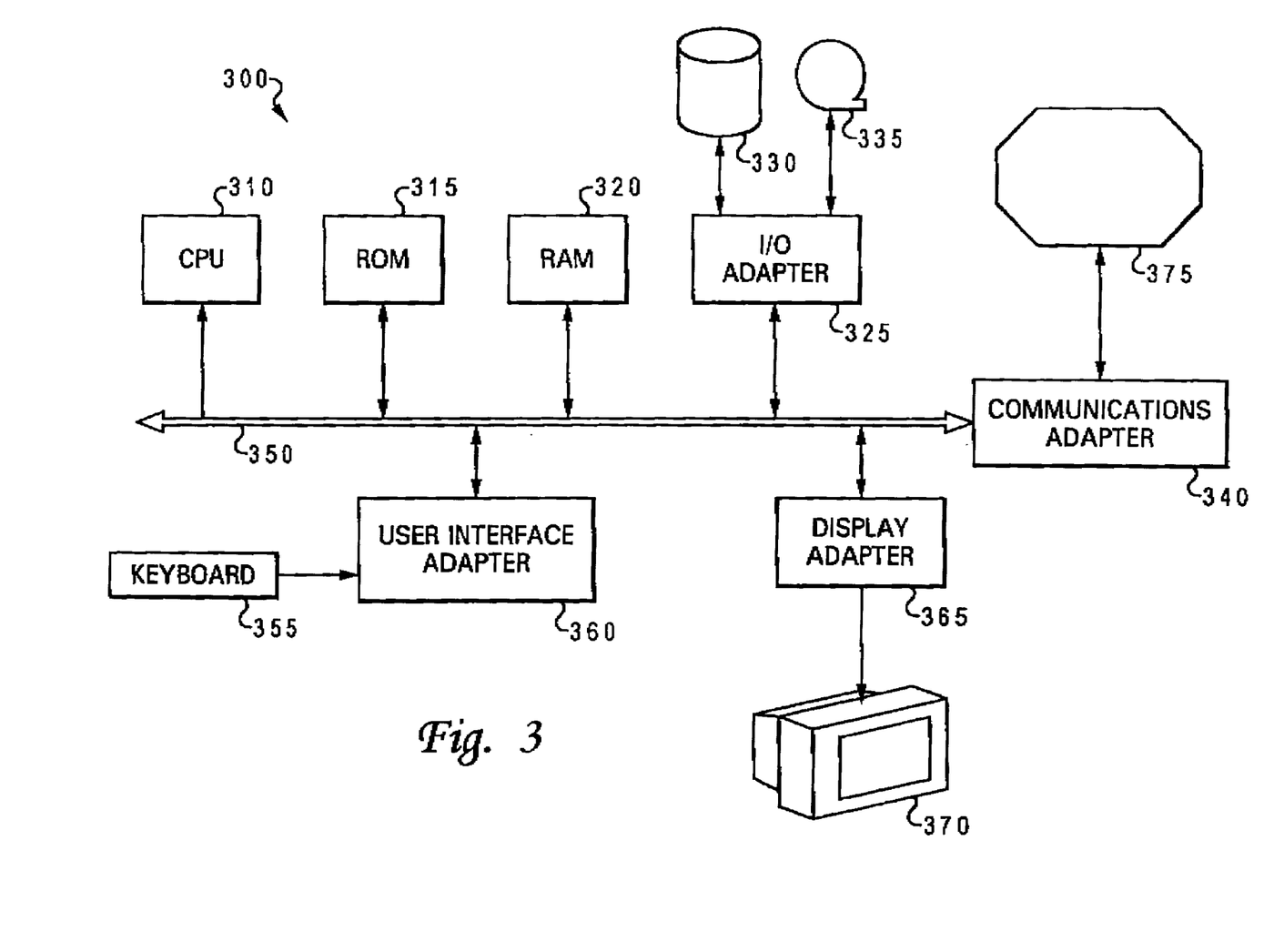
FIG. 3 illustrates an exemplary data processing system that provides a suitable environment for the practice of the present invention.

In an advantageous embodiment, the driving point model utilizing a realizable reduced order circuit disclosed by the present invention is implemented as a computer executable software program utilized as part of a timing analysis tool, such as International Business Machines (IBM) EinsTimer™. As depicted in FIG. 3, the present invention may be implemented within an exemplary data processing system 300. Data processing system 300 illustrates a typical hardware configuration of a computer workstation platform, such as IBM's RS/6000, that includes a central processing unit (CPU) 310 coupled to a number of devices via a system bus 350.

Data processing system 300 also includes a random access memory (RAM) 320, read only memory (ROM) 310 and input/output (I/O) adapter 325 for connecting peripheral devices, such as disk units 330 and tape units 335 to system bus 350. A user interface adapter 360 is utilized to connect a keyboard device 355 and a mouse (not shown) to system bus 350 while a display adapter 365 couples a display device 370, such as a monitor, to system bus 350. A communication adapter 340 is also depicted for coupling data processing system 300 to an external network, generally designated 375.

It should be noted that although the present invention has been described, in one embodiment, in the context of a computer workstation, those skilled in the art will readily appreciate that the present invention described hereinabove may be implemented, for example, by operating central processing unit 310 or other suitable electronic module to execute a corresponding sequence of machine-readable instructions. These instructions may reside in various types of signal-bearing media. In this respect, one aspect of the present invention concerns a programmed product, that includes signal-bearing media tangibly embodying a program of machine-readable instructions executable by a digital data processor to perform the computation of delays utilizing the realizable reduced order circuit described above. The present invention does not contemplate limiting its practice to any particular type of signal-bearing media, i.e., computer readable medium, utilized to actually carry out the distribution. Examples of signal-bearing media includes recordable type media, such as floppy disks and hard disk drives, and transmission type media such as digital and analog communication links and wireless.

Figure 4:
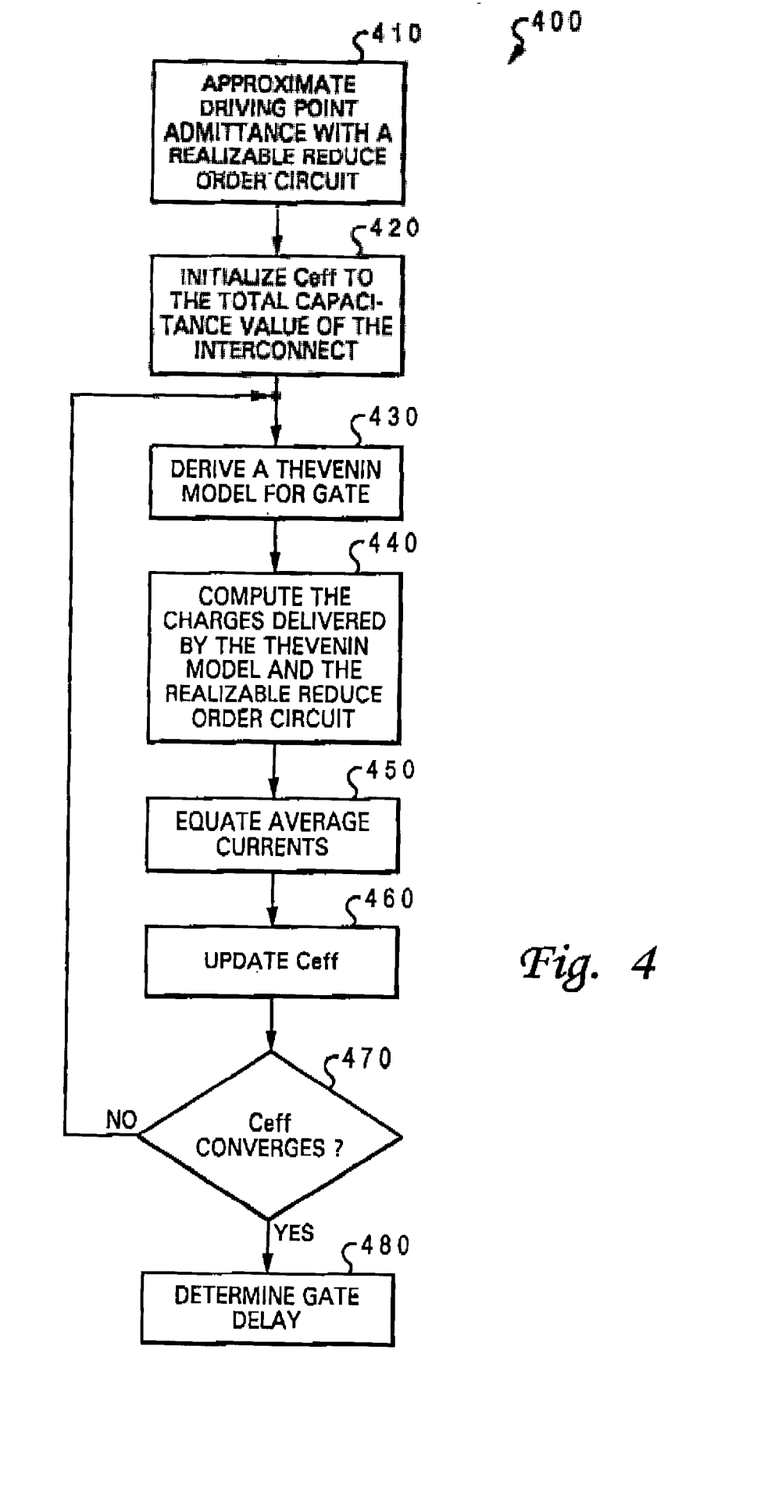
FIG. 4 illustrates a high-level process flow for determining a delay at a gate driving an interconnect having resistive, capacitive and inductive elements.

The utilization of the driving point model utilizing a realizable reduce order circuit of the present invention will hereinafter be described in greater detail with respect to FIG. 4 that depicts a high-level process flow 400 for determining a delay at a gate driving an interconnect having resistive, capacitive and inductive elements. Process 400 is initiated, as illustrated in step 410, when the driving point admittance of the interconnect is approximated with a reduced order circuit (analogous to reduced order circuit 210 shown in FIG. 2A). The values of the first four moments of the input admittance of the interconnect, i.e., $z_{-1}$, $z_0$, $z_1$ and $z_2$, are calculated utilizing moments values obtained typically from another analysis tool utilizing techniques such as described in, e.g., L. T. Pillage and R. A. Rohrer "Asymptotic Waveform Evaluation for Timing Analysis," IEEE Trans. on CAD, April 1990.

After the moments have been obtained, the signs of the third and fourth moments, i.e., $z_1$ and $z_2$, are evaluated to select a value of "x" utilizing Table 1. The realizability parameter k is next calculated where $k=(1-x)/(1+x)$. Additionally, the value of C, where $C=1/z_{-1}$, is also determined. With the value of C and the realizabilty parameter k known, the values of first and second capacitances are obtained utilizing the following relationships $C1=(1-k)/(C/2)$ and $C2=(1+k)/(C/2)$. The remaining components of the reduced order circuit, inductance L, first and second resistances R1, R2 are then determined utilizing equations (21) through (23).

Figure 5A:
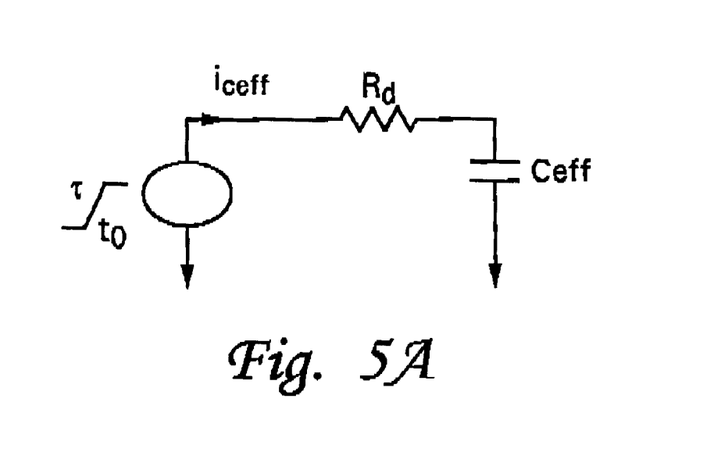
FIG. 5A illustrates an exemplary circuit representation of a Thevenin model for a gate driving an effective capacitance load.
Figure 5B:
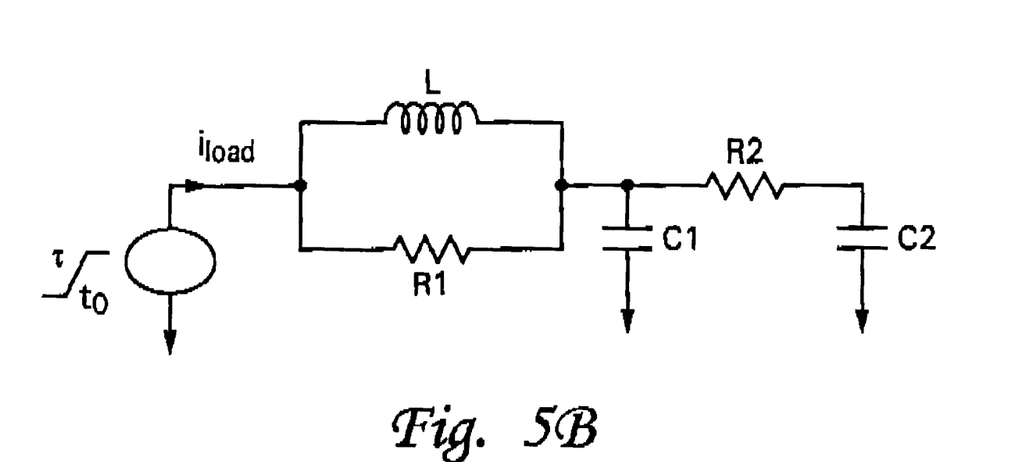
FIG. 5B illustrates an exemplary circuit representation of a Thevenin model for a gate driving the realizable reduced order circuit of the present invention.

Following the determination of the components of the reduced order circuit, the value of the effective capacitance (Ceff) of the interconnect is initialize to the total capacitance value of the interconnect, as depicted in step 420. In an advantageous embodiment, the total capacitance value is the combined value of first and second capacitances C1, C2. Next, as illustrated in step 430, a Thevenin circuit model for the gate driving the effective capacitance (Ceff) is derived using conventional techniques well known in the art. An exemplary illustration of the Thevenin model for the gate driving the effective capacitance is shown in FIG. 5A. Similarly, a Thevenin model for the gate driving the reduced order circuit is also derived and an exemplary embodiment is illustrated in FIG. 5B.

Next, as illustrated in step 440, the charges $i_{c_{eff}}$ and $i_{load}$ delivered by the Thevenin models of the gate and reduced order circuit, respectively, are computed. As shown in FIG. 5B, $i_{load}$ can be evaluated as:

$$i_{load} = L^{-1}\left[\frac{V_s}{R_d + Z(s)}\right] = L^{-1}\left[\frac{1/\tau}{s^2(R_d + Z(s))}\right] \quad (26)$$

The inverse Laplace transform $L^{-1}$ can be found by partial fraction expansion since the poles and residues can be explicitly computed in terms of the reduced order circuit elements, without a Pade approximation. Thus the poles are guaranteed to lie on the LHP of the s plane and produce a stable response. Next, the average currents drawn by Ceff and the reduced order circuit are equated, as depicted in step 450, to update the value of the effective capacitance Ceff, as illustrated in step 460.

Next, as depicted in decisional step 470, process 400 determines if the computed effective capacitance value has converged, i.e., the effective capacitance value before the average currents are equated and the updated effective capacitance value are equal. If it is determined that the computed effective capacitance value has not converged, process 400 is repeated starting at step 430 where a new Thevenin mode for the gate utilizing the updated effective capacitance value is derived. On the other hand, if it is determined that the effective capacitance value has converged, the delay at the gate is then determined, as illustrated in step 480. For precharacterized gates, the determination of the delay is accomplished utilizing lookup tables that map gate delay values to an output load capacitance, i.e., effective capacitance, and input transition times. For non-precharacterized gates, the delay may be obtained utilizing conventional fast timing simulators.

While the invention has been particularly shown and described with reference to a preferred embodiment, it will be understood by those skilled in the art that various changes in form and detail may be made therein without departing from the spirit and scope of the invention.

What is claimed is:

1. A method for determining an equivalent load at the output of a gate driving an interconnect having resistive, inductive and capacitive elements, said method comprising:

modeling said interconnect utilizing a passive driving point model to derive a realizable reduced order circuit for said interconnect including obtaining the first four moments of an input admittance of said interconnect; and     utilizing said realizable reduced order circuit to determine said equivalent load.

2. The method as recited in claim 1, wherein said equivalent load is an effective capacitance value of said interconnect.

3. The method as recited in claim 2, wherein said utilizing said realizable reduced order circuit includes:

(a) approximating a driving point admittance of said interconnect with said realizable reduced order circuit;

(b) initializing an effective capacitance value of said interconnect to a total capacitance value of said interconnect;

(c) deriving a Thevenin circuit model for said gate;

(d) computing charges delivered by said Thevenin gate model to said effective capacitance and said realizable reduced order circuit;

(e) updating said effective capacitance value by equating an average current drawn by said effective capacitance to an average current drawn by said realizable reduced order circuit; and     (f) repeating (c) through (e) until said effective capacitance value converges.

4. The method as recited in claim 1, wherein said realizable reduced order circuit includes a first resistance parallel-coupled to an inductance and series-coupled to a pi-model equivalent circuit, wherein said pi-model equivalent circuit includes a second resistance and first and second capacitances.

5. The method as recited in claim 1, wherein said first four moments are characterized by:

$z_{-1} = 1/C,$ $z_0 = [(1+k)^2 R2]/4,$ $z_1 = L - (1/16)C(1-k)(1+k)^3 R2^2,$ and $z_2 = (1/64)C^2(1-k)^2(1+k)^4 R2^3 - (L^2/R1),$ wherein $z_{-1}$, $z_0$, $z_1$, and $z_2$ are said first, second, third and fourth moments, respectively, L is said inductance, R1 and R2 are said first and second resistances, respectively, k is a realizability parameter and said first and second capacitances are defined by $(1-k)(C/2)$ and $(1+k)(C/2)$, respectively.

6. A method for determining a delay at a gate driving an interconnect having resistive, inductive and capacitive elements, said method comprising:
  deriving a realizable reduced order circuit of said interconnect utilizing a passive driving point model including obtaining the first four moments of an input admittance of said interconnect;
  utilizing said realizable reduced order circuit to determine an equivalent load at the output of said gate; and
  determining said delay utilizing said equivalent load.

7. The method as recited in claim 6, wherein said equivalent load is an effective capacitance value of said interconnect.

8. The method as recited in claim 7, wherein said utilizing said realizable reduced order circuit includes:
  (a) approximating a driving point admittance of said interconnect with said realizable reduced order circuit;
  (b) initializing an effective capacitance value of said interconnect to a total capacitance value of said interconnect;
  (c) deriving a Thevenin circuit model for said gate;
  (d) computing charges delivered by said Thevenin gate model to said effective capacitance and said realizable reduced order circuit;
  (e) updating said effective capacitance value by equating an average current drawn by said effective capacitance to an average current drawn by said realizable reduced order circuit; and
  (f) repeating (c) through (e) until said effective capacitance value converges.

9. The method as recited in claim 8, wherein determining said delay includes referring to a lookup table to obtain a precharacterized gate delay value corresponding to said effective capacitance value.

10. The method as recited in claim 6, wherein said realizable reduce order circuit includes a first resistance parallel-coupled to an inductance and series-coupled to a pi-model equivalent circuit, wherein said pi-model equivalent circuit includes a second resistance and first and second capacitances.

11. The method as recited in claim 6, wherein said first four moments are characterized by:

$z_{-1} = 1/C,$ $z_0 = [(1+k)^2 R2]/4,$ $z_1 = L - (1/16)C(1-k)(1+k)^3 R2^2,$ and $z_2 = (1/64)C^2(1-k)^2(1+k)^4 R2^3 - (L^2/R1),$ wherein $z_{-1}$, $z_0$, $z_1$, and $z_2$ are said first, second, third and fourth moments, respectively, L is said inductance, R1 and R2 are said first and second resistances, respectively, k is a realizability parameter and said first and second capacitances are defined by $(1-k)(C/2)$ and $(1+k)(C/2)$, respectively.

12. A data processing system, comprising:
  a processor; and
  means for determining a delay at a gate driving an interconnect having resistive, inductive and capacitive elements, said means for determining a delay including:
    means for deriving a realizable reduced order circuit of said interconnect utilizing a passive driving point model including obtaining the first four moments of an input admittance of said interconnect;
    means for utilizing said realizable reduced order circuit to determine an equivalent load at the output of said gate; and
    means for determining said delay utilizing said equivalent load.

13. The data processing system as recited in claim 12, wherein said equivalent load is an effective capacitance value of said interconnect.

14. The data processing system as recited in claim 13, wherein said means for utilizing said realizable reduced order circuit includes:
  (a) means for approximating a driving point admittance of said interconnect with said realizable reduced order circuit;
  (b) means for initializing an effective capacitance value of said interconnect to a total capacitance value of said interconnect;
  (c) means for deriving a Thevenin circuit model for said gate;
  (d) means for computing charges delivered by said Thevenin gate model to said effective capacitance and said realizable reduced order circuit;
  (e) means for updating said effective capacitance value by equating an average current drawn by said effective capacitance to an average current drawn by said realizable reduced order circuit; and
  (f) means for repeating (c) through (e) until said effective capacitance value converges.

15. The data processing system as recited in claim 14, wherein said means for determining said delay includes means for referring to a lookup table to obtain a precharacterized gate delay value corresponding to said effective capacitance value.

16. The data processing system as recited in claim 12, wherein said realizable reduced order circuit includes a first resistance parallel-coupled to an inductance and series-coupled to a pi-model equivalent circuit, wherein said pi-model equivalent circuit includes a second resistance and first and second capacitances.

17. The data processing system as recited in claim 12, wherein said first four moments are characterized by:

$z_{-1} = 1/C,$ $z_0 = [(1+k)^2 R2]/4,$ $z_1 = L - (1/16)C(1-k)(1+k)^3 R2^2,$ and $z_2 = (1/64)C^2(1-k)^2(1+k)^4 R2^3 - (L^2/R1),$ wherein $z_{-1}$, $z_0$, $z_1$, and $z_2$ are said first, second, third and fourth moments, respectively, L is said inductance, R1 and R2 are said first and second resistances, respectively, k is a realizability parameter and said first and second capacitances are defined by $(1-k)(C/2)$ and $(1+k)(C/2)$, respectively.

18. A computer program product, comprising:
a computer-readable medium having stored thereon computer executable instructions for implementing a method for determining a delay at a gate driving an interconnect having resistive, inductive and capacitive elements, said computer executable instructions when executed, perform the steps of:
deriving a realizable reduced order circuit of said interconnect utilizing a passive driving point model including obtaining the first four moments of an input admittance of said interconnect;
utilizing said realizable reduced order circuit to determine an equivalent load at the output of said gate; and
determining said delay utilizing said equivalent load.

19. The computer program product as recited in claim 18, wherein said equivalent load is an effective capacitance value of said interconnect.

20. The computer program product as recited in claim 19, wherein said utilizing said realizable reduce order circuit includes:
(a) approximating a driving point admittance of said interconnect with said realizable reduced order circuit;
(b) initializing an effective capacitance value of said interconnect to a total capacitance value of said interconnect;
(c) deriving a Thevenin circuit model for said gate;
(d) computing charges delivered by said Thevenin gate model to said effective capacitance and said realizable reduced order circuit;
(e) updating said effective capacitance value by equating an average current drawn by said effective capacitance to an average current drawn by said realizable reduced order circuit; and
(f) repeating (c) through (e) until said effective capacitance value converges.

21. The computer program product as recited in claim 20, wherein determining said delay includes referring to a lookup table to obtain a precharacterized gate delay value corresponding to said effective capacitance value.

22. The computer program product as recited in claim 18, wherein said realizable reduced order circuit includes a first resistance parallel-coupled to an inductance and series-coupled to a pi-model equivalent circuit, wherein said pi-model equivalent circuit includes a second resistance and first and second capacitances.

23. The computer program product as recited in claim 18, wherein said first four moments are characterized by:

$z_{-1}1/C,$ $z_0 = [(1+k)^2 R2]/4,$ $z_1 = L - (1/16)C(1-k)(1+k)^3 R^2,$ and $z_2 = (1/64)C^2(1-k)^2(1+k)^4 R2^3 - (L^2/R1),$ wherein $z_{-1}$, $z_0$, $z_1$, and $z_2$ are said first, second, third and fourth moments, respectively, L is said inductance, R1 and R2 are said first and second resistances, respectively, k is a realizability parameter and said first and second capacitances are defined by $(1-k)(C/2)$ and $(1+k)(C/2)$, respectively.

* * * * *